(12) United States Patent
Kubota

(10) Patent No.: US 6,452,089 B1
(45) Date of Patent: *Sep. 17, 2002

(54) SOLAR BATTERY MODULE

(75) Inventor: Yuichi Kubota, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/886,214

(22) Filed: Jun. 22, 2001

Related U.S. Application Data

(63) Continuation of application No. 09/276,495, filed on Mar. 25, 1999, now Pat. No. 6,268,558.

(30) Foreign Application Priority Data

Mar. 25, 1998 (JP) .............................. 10-096602

(51) Int. Cl.⁷ .................. H01L 25/00; H01L 31/048
(52) U.S. Cl. ................ 136/251; 136/244; 136/246; 136/291; 368/205
(58) Field of Search ................ 136/244, 246, 136/291, 251; 368/205

(56) References Cited

U.S. PATENT DOCUMENTS 4,038,104 A * 7/1977 Tsutomu ..................... 136/244
6,067,277 A * 5/2000 Dinger et al. ............... 368/205
6,229,766 B1 * 5/2001 Saurer et al. ............... 368/205
6,268,558 B1 * 7/2001 Kubota ....................... 136/244

FOREIGN PATENT DOCUMENTS

| JP | 60-148174 A | 8/1985 |
| JP | 63-15070 U | 2/1988 |
| JP | 63-15072 U | 2/1988 |
| JP | 2-94575 A | 4/1990 |
| JP | 5-29641 A | 2/1993 |
| JP | 7-42147 U | 7/1995 |
| JP | 7-283427 A | 10/1995 |

* cited by examiner

Primary Examiner—Alan Diamond
(74) Attorney, Agent, or Firm—Oblon, Spivak, McClelland, Maier & Neustadt, P.C.

(57) ABSTRACT

An object of the invention is to provide a solar battery module having a high efficiency power generating ability, a harmony of design without an odd sensation, and a freedom of design. The object is achieved by a solar battery module comprising, on a light-receiving surface thereof, a photoelectric conversion section for converting incident light into electricity, the photoelectric conversion section comprising silicon, and an insulating color film disposed in regions other than the photoelectric conversion section for reducing a color difference from the photoelectric conversion section.

18 Claims, 4 Drawing Sheets

SOLAR BATTERY MODULE

This application is a Continuation of application Ser. No. 09/276,495 filed on Mar. 25, 1999, now U.S. Pat. No. 6,268,558.

BACKGROUND OF THE INVENTION

1. Technical Field

This invention relates to solar battery modules of portable or other types as typified by electronic equipment applications having solar batteries built therein, and more particularly, to solar battery modules serving as photovoltaic devices which when integrated in equipment, provide a harmony of color, and especially of design and have a color not causing an odd sensation despite solar battery mounting.

2. Background Art

Solar batteries are utilized in various electronic equipment as a power supply substitute for dry batteries. In particular, low power consumption electronic equipment such as electronic desktop calculators, watches, and portable electronic equipment (e.g., cameras, cellular phones and commercial radar detectors) can be fully driven by the electromotive force of solar batteries, so that the equipment can operate semi-permanently without a need for battery replacement. Because of the semi-permanent operation combined with cleanness to the environment, solar batteries are of great interest.

When solar batteries are built in electronic equipment, a consideration must be taken from the design aspect. In particular, modern electronic equipment are at an equal performance level imposing difficulty to discriminate one as superior in performance to another and the choice of a product by the consumer often depends on the superiority of design. Because of the structure of the solar battery, the mechanism of the light-receiving surface is visually perceivable from the exterior. Therefore, the design is largely affected by the difference in brightness or color between the photoelectric conversion section having a photoelectric converting function on the light-receiving surface and other regions such as electrodes, isolation walls and other structures. As a general rule, if these structures are viewed from the exterior, most of them have a detrimental effect on the design.

JP-A 60-148174 discloses a solar battery comprising at its front face a selective reflecting layer (multilayer interference filter such as a dichroic mirror) which selectively reflects a portion of visible light having a specific wavelength band, transmits the reminder and transmits at least a portion of light in a wavelength band contributing to the power generation of the solar battery and a light diffusing layer disposed on the front surface of the selective reflecting layer. With this construction, the solar battery exhibiting a dark color becomes the lowermost layer, the "selective reflecting layer" is provided as an upper layer on its light-receiving surface side for changing the color to a color of preference, and a "diffuse transmission layer" is provided as an upper layer thereon for rendering the reflected light brighter for reducing the dark color of the solar battery so that the color is controllable to some extent. This allows for a freedom of design of the color and other factors of the built-in system, thereby mitigating the odd sensation in product design caused by incorporating the solar battery.

The solar battery module that has been used in practice has a photoelectric conversion film capable of producing a photovoltaic force, a transparent electrode, a comb-shaped collector electrode in the form of a conductive silver film formed on the transparent electrode, and a conductive film of Ag, Cu, Ni, Mo or alloys thereof, carbon black or graphitized carbon black serving as a peripheral wiring electrode. The transparent conductive films known in the art include $SiO_2$-doped ITO films, $SnO_2$ films inclusive of Sb or F doping type), and ZnO films (inclusive of In, Al or Si doping type). Of these, ITO is commonly used. In addition, by forming a multi-stage cell structure capable of producing a desired high voltage on a single substrate, by forming a printed insulating film for patterning necessary for series connection, by effecting laser scribing/patterning by a dry process followed by printing of an insulating resin thereon to form barriers, or by printing conductive ink to form a laser bonding structure, an integrated structure is established (this is more outstanding in the case of a film solar cell which is easy to form into an integrated structure). With respect to the color of the solar battery as viewed from its light-receiving surface, a uniform color surface given by the interference color of the transparent electrode thin film (dictating the majority of the color of the solar battery) which is overlapped by the color of the α-Si photoelectric conversion film is mixed with patterns of various line widths having optical characteristics including high light reflectance, high light absorbance, high light transmittance and specific wavelength absorption caused by the formation of the above integrated structure, interfering with the color harmony from the design standpoint.

One patterning process is capable of integrating a transparent electrode formed on a substrate by sputtering through a metal mask, a photoelectric conversion film by plasma CVD, and a metal electrode by sputtering together, without using screen printing or laser scribing. Of these components, the metal electrode overlapping the mask shielding area exhibits a high reflectance and provides a high contrast to the photoelectric conversion section within the non-mask shielding area, giving an odd sensation. It is quite difficult to eliminate the odd sensation even when a diffuse transmission layer is formed on top of the cell to provide a shield.

Accordingly, even when the selective reflecting layer and diffuse transmission layer described in the above-referred patent are formed as upper layers on the light-receiving surface side of the solar battery, various pattern lines which are different in brightness, color, reflectance and clearness due to the respective optical characteristics are viewed as being admixed in the uniform color surface and look like a relief. To render these pattern lines to be not perceivable to the view is a key factor in eliminating the odd sensation in product design caused by building in the solar battery although the conventional solar battery design lacked a careful consideration taken to allow for a freedom of product design. In particular, for the "solar watch" in which the movement can be driven by the electromotive force that a solar battery produces at an indoor low illuminance, stringent design requirements are imposed. Further, when a watch dial plate of a color selected from a wide range, though frequently white, serving as a selective reflecting layer and a diffuse transmission layer too is provided as an upper layer on the light-receiving surface side of the solar battery, the gap therebetween should be reduced to a nearly contact state due to the thickness reduction demand. The above requirements should be met even under such service circumstances.

Further, the solar battery module is required to improve the power generation efficiency at a given light source and illuminance, or to form a multi-stage integrated structure to improve the voltage to comply with the requirement of a particular device used, to thereby improve battery performance whereas giving the solar battery-built-in product itself a freedom of design in harmony with the surrounding environment is also a technical task to be solved for the solar battery to find a wider range of market as a clean energy source.

SUMMARY OF THE INVENTION

An object of the invention is to provide a solar battery module having a high efficiency power generating capability, maintaining a design harmony, free of an odd sensation, having a freedom of design, stable to changes in the environment such as outdoor or indoor temperature and humidity, and having a high dimensional precision.

In the solar battery module of the invention, an insulating ink having a hiding power and a color closest to the color of the solar battery surface (almost dictated by the interference colors of an ITO transparent electrode thin film) is prepared, and an insulating pattern and electrode exposed on the solar battery surface are concealed by patterning the ink of this color by a screen printing technique. With respect to an insulating pattern and conductive pattern having a different color from the solar battery surface, having a high light reflectance, high light absorbance, high light transmittance, and specific wavelength band absorption and exposed to the solar battery surface, the same ink is overcoated by a similar printing technique to a minimum thickness necessary to maintain hiding. This unifies the solar battery surface to a uniform color. Although a contrast is ascertainable with a pigment-dispersed ink film having a higher content of diffuse reflectance components unlike a high reflectance film formed by a dry process, the contrast is mitigated, maintaining a color harmony in design.

To obtain a solar batter cell whose solar battery surface is unified to a uniform color, which becomes the lowermost layer and in which a "diffuse transmission layer" is provided as an upper layer on its light-receiving surface side or to obtain a solar battery of any desired color, the cell in which the diffuse transmission layer itself is given a color or the "selective reflecting layer" is provided as an upper layer on the "diffuse transmission layer" or as an intermediate layer between it and the solar battery is effective.

The above and other objects are achieved by the following constructions.

(1) A solar battery module comprising, on a light-receiving surface thereof,
a photoelectric conversion section for converting incident light into electricity, said photoelectric conversion section comprising silicon, and
an insulating color film disposed in regions other than said photoelectric conversion section for reducing a color difference from said photoelectric conversion section.

(2) The solar battery module of (1) wherein said insulating color film comprises pigment particles dispersed in a binder.

(3) The solar battery module of (1) wherein said insulating color film comprises a microparticulate white pigment as pigment particles dispersed therein.

(4) The solar battery module of (1) wherein said photoelectric conversion section comprises a non-single-crystal silicon film.

(5) The solar battery module of (1) further comprising a diffuse transmission layer above the light-receiving surface of the solar battery module.

(6) The solar battery module of (5) wherein the color difference ΔE between the insulating color film and the photoelectric conversion section as perceived through the diffuse transmission layer is up to 5.0.

(7) The solar battery module of (5) further comprising a selective reflecting layer above and/or below said diffuse transmission layer.

(8) The solar battery module of (5) wherein said diffuse transmission layer has an overall light transmittance of at least 20% and a haze of at least 8% in the visible spectrum.

(9) The solar battery module of (1) wherein said photoelectric conversion section has a transparent conductive film.

(10) The solar battery module of (1) comprising a substrate made of any of light transmissive, heat resistant resins, glass and stainless steel.

(11) The solar battery module of (1) wherein a hot-melt web having a buffer adhesive layer containing a thermosetting resin is laminated on at least one surface of a substrate made of any of light transmissive, heat resistant resins, glass and stainless steel.

(12) The solar battery module of (11) wherein said substrate and/or said buffer adhesive layer contains a UV absorber or has a UV absorber localized on a surface thereof.

(13) The solar battery module of (11) wherein said buffer adhesive layer contains an organic peroxide.

(14) The solar battery module of (11) wherein the hot-melt web has a support film, and the support has a glass transition temperature of at least 65° C. or a heat resistant temperature of at least 80° C. prior to thermocompression bonding.

(15) The solar battery module of (11) wherein the hot-melt web has a support film, and the support has a molecular orientation ratio (MOR) of from 1.0 to 3.0 prior to thermocompression bonding.

(16) The solar battery module of (11) wherein the organic peroxide has a decomposition temperature of at least 70° C. at a half life of 10 hours prior to thermocompression bonding.

(17) The solar battery module of (1) further comprising a protective coating film having light transparency and heat resistance on said photoelectric conversion section.

(18) A solar battery module further comprising a layer of the hot-melt web of (11) on said protective coating film.

(19) A watch comprising the solar battery module of (1).

Operation

In the prior art solar battery, no consideration has been made on the unification of color including colored portions of fine wires constructing various functional patterns indispensable for battery formation other than the color of a power generating layer, that is, a photoelectric conversion section. Therefore, an approach of forming a selective reflecting layer and a diffuse transmission layer having both functions of diffusing and transmitting incident light as upper layers on the light-receiving surface while insuring a power generating capability failed to achieve hiding by unifying colors including the colored portions of the respective functional patterns other than the color of the photoelectric conversion section. According to the invention, an insulating ink having a color closest to the color of the photoelectric conversion section is prepared and as such, used to form an insulating pattern film on the surface-exposed portions of the solar battery. Alternatively, with respect to an insulating pattern and conductive pattern having a high light reflectance, high light absorbance, high light transmittance, and specific wavelength band absorption, an ink hiding process of overcoating them with the same ink as an upper layer is effective.

To obtain a solar battery of whitish or light surface color and of high quality, a method of using as the lowermost layer the cell in which the surface of the solar batter has been unified to a uniform color by the above-mentioned ink hiding process, providing a diffuse transmission layer as an upper layer on its light-receiving surface side, and further providing a selective reflecting layer is quite effective.

As expressed by the L*a*b* color space (representing brightness, redness and blueness, respectively), the color difference value ΔE between the photoelectric conversion section and the regions other than the photoelectric conversion section coated with the insulating color ink is 3.0 or less. Also, the color difference value ΔE between the surface color of the solar battery as perceived through the diffuse transmission layer (based on a white filter) and the color of the insulating color ink approximate to the surface color of the solar battery as perceived through the diffuse transmission layer (based on a white filter) is preferably up to 3.0, more preferably up to 2.0. In this case, the values of the L*a*b* color space of the surface color of the solar battery as a reference are (44.51, 6.47, 2.24), respectively, whereas the values of the L*a*b* color space of the surface color of the while filter (diffuse transmission layer) used are (69.12, 0.93, 3.88), respectively. The white filter has an overall light transmittance Tt of 47.9%, a diffuse transmittance Td of 33.8%, and a haze value of 70.6%.

For solar watches using ordinary whitish dial plates, the most effective insulating color ink approximate to the surface color of the solar battery is a current insulating ink whose pigment component is a mixture of rutile type titanium dioxide having a high hiding power and a brown pigment (e.g., red iron oxide) having light resistance.

As to watches for outdoor use such as sports diver watches, on the other hand, solar watches of a design having a blackish dial plate are popular. In this case, filters having a low brightness such as blackish filters having an overall light transmittance of 40 to 20% in the visible spectrum, a haze value of 10 to 15% indicating a diffuse transmittance of substantially nil, and a brightness L* as low as about 10 are often used as the diffuse transmission layer. When such a filter is provided on the light-receiving surface side, the tone of this filter itself is visually seen more blackish than the tone of the solar battery surface color as visually seen through the filter. As a consequence, the measure of unifying the battery surface color as required on the use of the above whitish filter having a high overall light transmittance and diffuse light transmittance is not needed. It creates least odd sensation on visual observation that the tone of the hiding ink to be overcoated as an upper layer on the non-power generating regions of the solar battery is made closer to the tone of reflected light which is reflected by the photoelectric conversion film of the cell through a blackish, low-brightness filter and visually seen substantially black. In this case, even if the color difference ΔE between the power generating film and the ink is considerably in excess of 3.0, by virtue of the black tone and extremely low transmittance of the black dial plate (the dial plate used in a typical example had a Tt of 2.6%, a Td of 2.7% and a haze of 10.7%) and the substantial elimination of light diffusing effect, the tone of return light which is reflected by the cell surface and visually seen through the filter (black dial plate) largely depends on the optical characteristics of the filter (black dial plate) only when the black filter is used. The watch is visually seen to have a unified black tone substantially independent of the magnitude of the color difference between different regions within the cell, as long as high reflectance metallic luster regions are partially absent.

DESCRIPTION OF THE PREFERRED EMBODIMENTS

Figure 1:
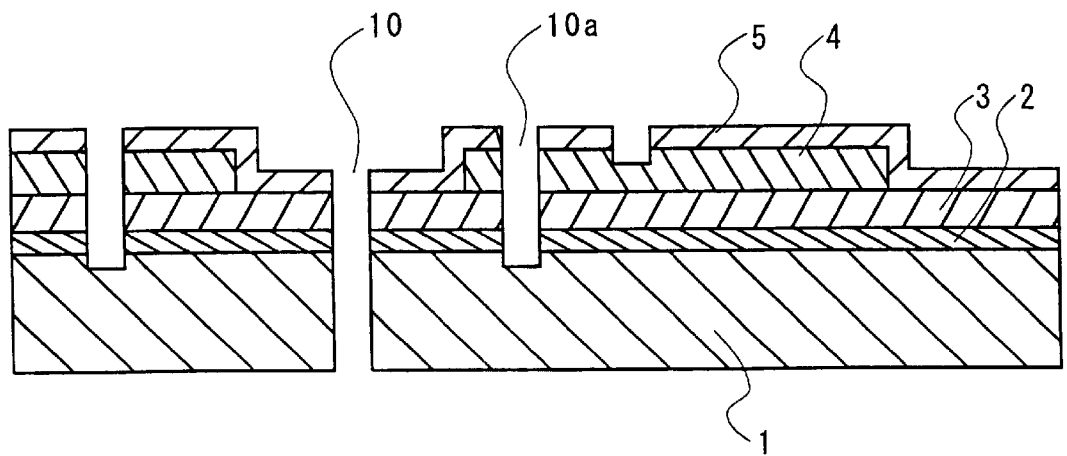
FIG. 1 is a fragmental cross-section illustrating one step of a process for preparing a solar battery cell for use in a solar battery module according to the invention.

The solar battery module of the invention comprises on a light-receiving surface thereof, a photoelectric conversion section for converting incident light into electricity, the photoelectric conversion section comprising silicon, and an insulating color film in regions other than the photoelectric conversion section, the insulating color film serving to reduce the color difference ΔE from the photoelectric conversion section exerted by the reflection of light containing at least the visible spectrum of light.

The photoelectric conversion section corresponds to a so-called power-generating layer and in solar batteries, generally has single crystal silicon, polycrystalline silicon, amorphous silicon (α-Si) or the like, to which a predetermined impurity is added to form a pn junction or pin junction.

The light-receiving surface of the solar battery is a surface on which light necessary for light-to-electricity conversion is incident and generally designates a surface having the photoelectric conversion section and other structures, but excluding a protective layer or the like on the face side of the solar battery.

The regions other than the photoelectric conversion section designate various structures or structure films necessary for the power generating function of the solar battery, excluding the photoelectric conversion section. The other regions are, for example, insulating patterns or conductive patterns, and more illustratively, collector electrodes such as Ag conductive film, peripheral wiring electrodes of Ag (metal thin films as typified by Cu, Cu compounds, Ni, Mo and Al and conductive films having metal microparticulates dispersed therein), thin films or microparticulate-dispersed films of carbon black, graphitized carbon black, etc. by a dry process, conductive films in which the metal microparticulates are mixed with carbon microparticulates, transparent electrodes of ITO, ZnO, $SnO_2$, etc., and printed insulating films.

The insulating color film serves to reduce the color difference from the photoelectric conversion section.

Specifically, the color difference ΔE is preferably up to 3.0, more preferably up to 2.5, most preferably up to 2.0 while the lower limit is not critical. Namely, the insulating color film is formed by applying an insulating color ink which is approximate to the surface color of the solar battery and adjusted such that the color difference ΔE from the photoelectric conversion section, inclusive of the color of the underlying portion and reflectivity, is preferably up to 3.0, when the film-formed surface is observed from the exterior. When a diffuse transmission layer (based on a whitish filter) as will be described later is used in combination, the color difference ΔE between the photoelectric conversion section and the insulating color film applied and formed on the other regions as visually perceived through the diffuse transmission layer is preferably up to 3.0, more preferably up to 2.0, especially up to 1.5.

Alternatively, the conductive pattern as the region other than the photoelectric conversion section, more illustratively, comb-shaped collector electrodes such as Ag conductive film, peripheral wiring electrodes of Ag (metal thin films as typified by Cu, Cu compounds, Ni, Mo and Al and conductive films having metal microparticulates dispersed therein), thin films or microparticulate-dispersed films of carbon black, graphitized carbon black, etc. by a dry process, conductive films in which the metal microparticulates are mixed with carbon microparticulates, may be adjusted in color such that the color difference between the conductive pattern and the photoelectric conversion section may fall within the above-specified range.

The color difference ΔE is generally expressed by National Bureau Standards (NBS) units, and can be determined according to the following equation for each of brightness L*, redness a* and blueness b* in the L*,a*,b* color space (indexes calculable from tristimulus values x, y and z as prescribed in JIS-Z8722 and JIS-Z8727), from the differences ΔL, Δa and Δb between the region where the insulating color film has been applied and the photoelectric conversion section.

$$\Delta E=[(\Delta L)^2+(\Delta a)^2+(\Delta b)^2]^{1/2}$$

Smaller values of this ΔE indicate that the color of the region having the insulating color film applied thereto is closer to the color of the photoelectric conversion section. As a general rule, ΔE values of greater than 3.0 allow a definite color difference to be perceived, and ΔE values of 12.0 or greater permit discrimination of two fully different kinds of color.

The insulating color film preferably consists of pigment particles dispersed in a binder. Especially preferred is a film of pigment particles dispersed such that the film has a low reflectance and induces diffuse reflection of light if reflected.

The binder used herein is not critical insofar as it is moderately resistant to weather and light, firmly adheres to various structures or structural films necessary for the electricity generating function of the solar battery other than the photoelectric conversion section, and allows for effective dispersion of pigment particles therein. When the regions other than the photoelectric conversion section are covered with a pattern by a screen printing technique, oil-soluble resins are preferable to aqueous emulsions because of good wettability of the film to the dry underlying layer. Examples of the oil-soluble resins include epoxy resins, especially phenoxy resins, olefinic resins, desirably polyethylene resins, polypropylene resins or polyisobutylene resins; vinyl resins, desirably ethylene-vinyl acetate copolymer resins, vinyl chloride-vinyl acetate copolymer resins or vinyl acetate resins or ethylene-vinyl chloride-vinyl acetate resins; acrylic resins, desirably methacrylate resins, polyacrylate resins, ethylene-ethyl acrylate copolymer resins or ethylene-methacrylic acid copolymer resins; phenolic resins; polyurethane resins; polyamide resins; polyester resins; ketone resins; alkyd resins; rosin resins; hydrogenated rosin resins; petroleum resins; hydrogenated petroleum resins; maleic acid resins; butyral resins; terpene resins; hydrogenated terpene resins; and chroman-indene resins; with the phenoxy resins, epoxy resins, urethane resins and saturated polyester resins being preferred. These resins are characterized by the weather resistance established by crosslinking, the mechanical strength as a composite material layer of the resin with a material dispersed therein, the bonding force to the underlying film of organic materials such as ink film or substrate film or inorganic materials such as ITO and α-Si, and the stability to environmental changes during long-term service. These resins are advantageous because of a high degree of freedom of molecular structure design. These resins (or polymers) may be used alone or in admixture of two or more.

The particulate pigment is not critical insofar as it provides a predetermined color close to the color of the material of which the photoelectric conversion section is made. One or more pigments are selected from those pigments having a high hiding power and dyeing power. Specifically, white or nearly colorless particulate pigments having a high hiding power such as titanium dioxide, zinc oxide, kaolin, clay, calcium carbonate, barium carbonate, calcium sulfate, barium sulfate, magnesium carbonate, silica, alumina and diatomaceous earth are preferably used in combination with pigments having a high dyeing power such as red iron oxide, carbon black, microparticulate graphite, Prussian blue, cobalt blue, and phthalocyanine pigments. In particular, admixing of rutile-type titanium dioxide ($TiO_2$) having a high hiding power and a high degree of whiteness can produce a pastel tone intermediate color which is effective in hiding the underlying light-receiving surface and close to the diffuse tone of the underlying color. This is effective in accomplishing uniformity of tone particularly when a diffusing filter layer of whitish or light color having an overall light transmittance of at least 30% is provided at the top.

Fine particulate iron oxide having a dyeing power is preferred because it offers a wide range of color selection covering purple, brown, red and black in matching with the tone of a solar battery of a structure having an ITO transparent electrode stacked on an amorphous silicon thin film and because it has light resistance and weather resistance like titanium dioxide.

Controlling the tone using a coat having pigment or dye particles dispersed therein is advantageous in achieving proper diffuse reflection of incident light and the uniformity of tone of the overall cell. For example, to prevent a substantial contrast difference between the photoelectric conversion section and a site attributable to the high reflectance of a metallic color thin film in the non-photoelectric conversion section covered with a mask pattern by a dry process, a pigment dispersed, tone controlled coating may be provided by a screen printing technique at the top of the cell on the light-receiving side so as to cover the non-photoelectric conversion section. This effectively mitigates the tone difference from the photoelectric conversion section when a diffuse transmissive filter is laid thereon, so that the uniformity of tone of the overall cell is visually ascertained through the filter.

Also if desired, the color may be adjusted by using along with the above pigment a prior art well-known pigment, for example, carbon black, cadmium red, molybdenum red, chromium yellow, cadmium yellow, titanium yellow, chromium oxide, viridian, titanium cobalt green, ultramarine blue, Prussian blue, cobalt blue, azo pigments, phthalocyanine pigments, quinacridone pigments, isoindolinone pigments, dioxazine pigments, durene pigments, perylene pigments, perynone pigments, thioindigo pigments, quinophthalone pigments and metal complex pigments.

The use of Prussian blue, cobalt blue or phthalocyanine pigments as a single or main pigment is effective for equalizing tones when single crystal silicon or polycrystalline silicon is used as a solar battery without providing a light diffusion layer at the top, for example.

Also, a dye is preferably used instead of or in combination with the above pigment. Exemplary such dyes are oil-soluble dyes, for example, azo dyes, metal complex salt dyes, naphthol dyes, anthraquinone dyes, indigo dyes, carbonium dyes, quinoneimine dyes, xanthene dyes, cyanine dyes, quinoline dyes, nitro dyes, nitroso dyes, benzoquinone dyes, naphthoquinone dyes, phthalocyanine dyes, and metal phthalocyanine dyes.

Primary particles of the pigment may have a mean particle size of about 0.01 to about 0.8 $\mu$m. The amount of the pigment mixed is preferably about 30 to 500%, and more preferably about 50 to 380% by weight based on the binder.

As to means for forming the insulating color film, an insulating color ink having the binder and pigment particles dispersed and dissolved in a dispersing medium may be coated or otherwise applied onto a pre-selected region of the light-receiving surface of a solar battery by a screen printing technique. The coating has a thickness of about 15 to 30 $\mu$m when the underlying is other than a silver paste electrode film having a high reflectance and about 10 to 25 $\mu$m when the underlying is other than metals.

The dispersing medium is preferably one in which the binder and pigment are dissolvable and dispersible and which does not dissolve or attack a structure on the solar battery surface. Examples include cyclohexanone, isophorone, $\gamma$-butyrolactone, N-methylpyrrolidone, terpineol, octane, isooctane, decane, isodecane, decalin, nonane, dodecane, isododecane, cyclooctane, cyclodecane, benzene, toluene, xylene, mesitylene, Isoper E, Isoper G. Isoper H and Isoper L (Isoper is a trade name of Exxon), Shelsol 70 and Shelsol 71 (Shelsol is a trade name of Shell Oil), Amsco OMS and Amsco 460 solvents (Amsco is a trade name of Spirits), and acetates such as butylcarbitol acetate and butylcellosolve acetate. These may be used alone or in admixture of two or more. The amount of the binder and pigment added is about 40 to 180% by weight based on the dispersing medium.

In addition to the above ingredients, there may be admixed additives such as dispersants, anti-foaming agents and leveling agents if necessary. These additives are usually added in an overall amount of up to about 20% by weight.

As an upper layer on the light-receiving surface of the solar battery module, a diffuse transmission layer may be provided for the purpose of improving display quality or adding a design effect. The diffuse transmission layer is generally based on a white resin plate, is adjusted to a proper tone if necessary from the design standpoint, and in some cases, is blue or green or has a fluorescent ability to emit light upon exposure to UV light. The material of which the diffuse transmission layer is made is not critical and selected from transparent resins such as acrylic resins, methacrylic resins, polycarbonate resins, polystyrene resins, polyester resins, and polyacrylate resins. Other preferred materials used herein are obtained by uniformly dispersing in the foregoing resins a white filler, a finely divided product of any of the foregoing resins, a transparent inorganic or organic filler having a significantly different refractive index, or fine bubbles. The material may be light-colored to a degree not to interfere with power generation.

Especially in the watch application where the design factor is of importance, a diffuse transmission layer of black or nearly black color is sometimes used as the dial plate. In this case, carbon black or graphite fine particles may be admixed in an amount necessary to provide the color, but to insure a light transmittance of at least 20% which is the minimum level necessary for power generation.

On use of such a blackish, low transmittance dial plate as the diffuse transmission layer, although the underlying cell has a color difference $\Delta E$ of at least 3 or at least 6 between the photoelectric conversion region and the non-photoelectric conversion region, the influence of the underlying cell on color uniformity is mitigated by the interposing dial plate. It is then rather advantageous that the non-photoelectric conversion region avoids a metallic luster color having a high reflectance and is covered with a color coating having a blackish color similar to the dial plate and a low reflectance. The diffuse transmission layer preferably has an overall light ray transmission of at least 20%, more preferably at least 50%, and further preferably at least 70% in the visible spectrum and a haze of at least 50% and more preferably at least 70%. The percent "haze" is a transmittance of diffused light divided by a transmittance of overall light×100. The diffuse transmission layer has a thickness of about 25 to 800 $\mu$m.

In addition to the diffuse transmission layer, a selective reflecting layer may be provided. Upon receipt of visible light, for example, the selective reflecting layer is to selectively reflect or transmit light having a wavelength band of 450–480 nm (blue), 550–580 nm (yellowish green) or 590–620 nm (orange). Like the above diffuse transmission layer, the selective reflecting layer has the effect of improving display quality or adding a design effect. The selective reflecting layer is, for example, a dielectric multilayer film on a glass substrate, or an interference filter having a translucent silver thin film as the uppermost layer and a dielectric thin film interleaved, a dichroic mirror, diathermic mirror (cold mirror), and a light diffusing layer having a small amount of color pigment dispersed as the filler. The selective reflecting layer generally has a thickness of about 100 to 1,000 $\mu$m.

Next, a solar battery cell included in the solar battery module according to the invention is described.

Figure 4:
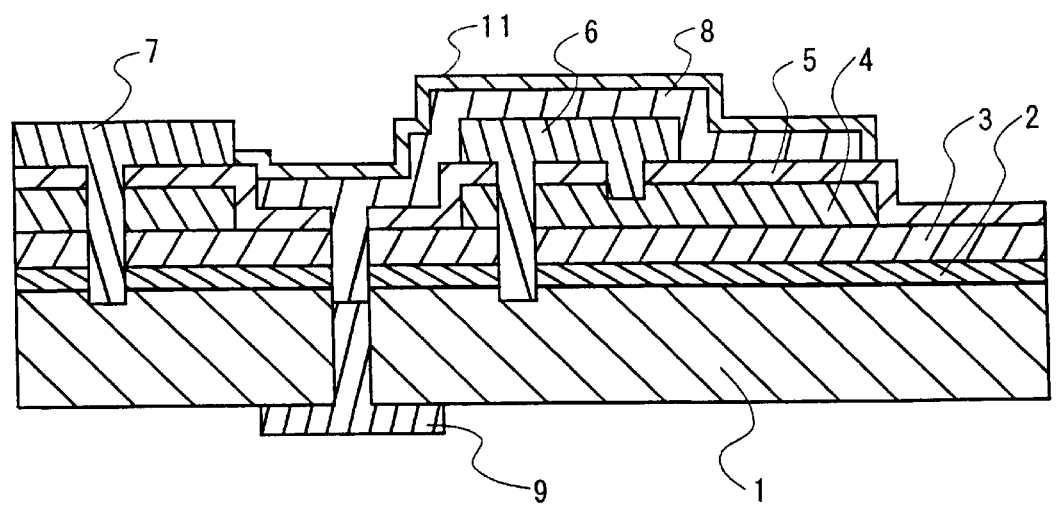
FIG. 4 is a fragmental cross-section illustrating a solar battery cell for use in a solar battery module according to the invention.

The solar battery cell according to the invention is illustrated in FIG. 4, for example, as comprising on a substrate 1, a lower electrode 2, a silicon-containing layer 3 of $\alpha$-Si or the like having a pn or pin junction, an insulating layer 4, and a transparent electrode 5 of ITO or the like. The cell further includes a first isolating layer 6, a second isolating layer 7, a wiring electrode 8, and a reverse-side lead-out electrode 9. It is understood that FIG. 4 is a fragmental cross section illustrating one exemplary construction of a solar battery cell.

In the solar battery cell, the photoelectric conversion section designates a region where light can pass through the transparent electrode 5 and enter the silicon-containing layer 3 to create in its interior an electromotive force which is taken out through the lower electrode 2 and the transparent electrode 5. The regions other than the photoelectric conversion section encompasses the insulating layer 4, first isolating layer 6, second isolating layer 7, and wiring electrode 8. These portions do not contribute to electricity generation and are formed of materials different from the photoelectric conversion section. As a result, these structural members interfere with the unity of design if they are located in a region where they are visually seen from the exterior and have a definite difference. Accordingly, the insulating color film is provided on these regions so that the color difference is reduced to or below the specific value, insuring the unity and harmony of design.

Figure 5:
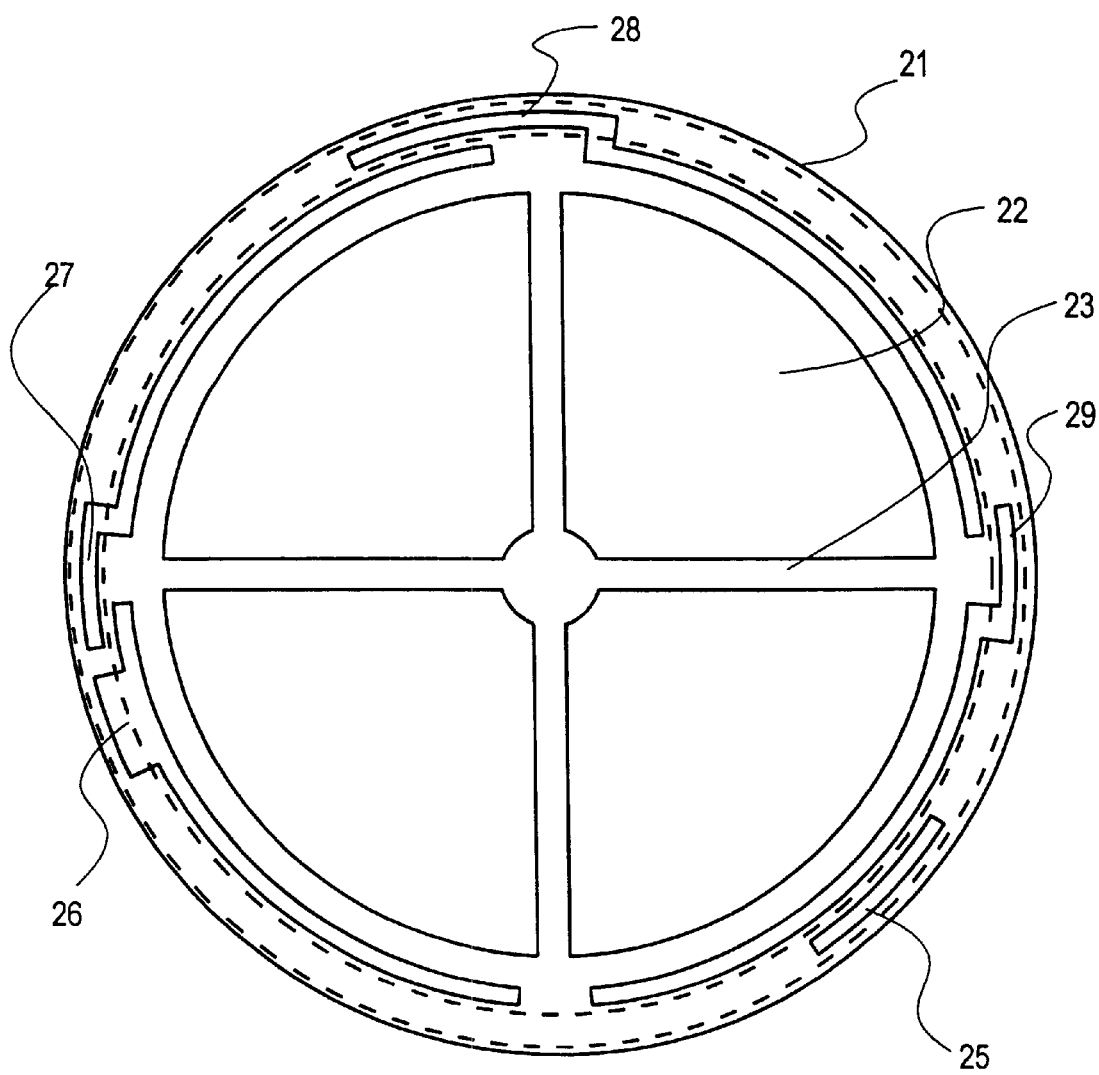
FIG. 5 is a plan view illustrating one exemplary arrangement of a circular solar battery.

Also, as shown in FIG. 5, for example, a circular solar battery cell 21 includes photoelectric conversion sections 22, an isolating portion 23 for isolating the photoelectric conversion sections 22 to form a series connected structure with an increased cell voltage, connections 27, 28 and 29 each having a series connected wiring structure, and lead-out electrodes 25, 26. The isolating portion 23 is generally more light-colored than the photoelectric conversion sections 22, whereas the connections 27, 28, 29 and the lead-out electrodes 25, 26 parts of which extend through the structure to the bottom are metallic color for wiring electrodes having a high reflectance when a conductive silver paste is used. If these structures are located where they are visually perceivable from the exterior, they interfere with the unity of design. Especially when the solar battery cell is incorporated in the dial plate of a watch, more stringent requirements are imposed from the design aspect, that is, the requirement for unity and harmony becomes enhanced. Therefore, by providing the insulating color film on these regions too, their color difference is reduced to or below the specific value, insuring the unity and harmony of design. If the underlying portion has a high reflectance as in the case of a metal portion, the insulating color film may be formed as a film of highly hiding ink to a thickness of about 30 μm, for example, optionally by coating two or more times.

After the insulating color film is formed, the solar battery cell is preferably provided with a surface coating member or encapsulating seal member for protecting the cell structure member from mechanical damages, oxidation and corrosion. Of these protective members, a lamination film is preferably used for sealing. As the especially preferred lamination film, the following hot-melt web is used for sealing.

For reducing the cost of the solar battery module, a protective coating of transparent resin may be used if permitted from a balance with the environmental resistance of the cell. That is, a transparent insulating film obtained by thermosetting a phenoxy resin with a melamine resin as described in Japanese Patent Application No. 9-320476 may be used as a sole protective film.

When lamination is undertaken, that is, a lamination film layer is formed on the surface of the solar battery cell, it achieves the same effect as the gap provided between the outermost surface of the cell body light-receiving portion and the rear surface of the dial plate and just corresponding to the thickness of the transparent laminate film support (for example, about 50 to 100 μm). The extent to which the tone of the solar battery cell is transmitted by and visually observed through the dial plate is advantageously reduced by the light diffusing effect of the dial plate. Therefore, the provision of the insulating color film is of significance especially for the solar battery cell having such a lamination seal.

The hot-melt web used herein has a buffer adhesive layer containing a thermosetting resin on at least one surface of a resinous support having light transparency and heat resistance.

Since the buffer adhesive layer on the resinous support is formed of a thermosetting polymer having rubbery elasticity which is a flexible resin having a high crosslinking density among polymer molecular chains, the buffer adhesive layer experiences minimal changes of dynamic physical properties with temperature and humidity changes. The very slow changes of dynamic physical properties permit the buffer adhesive layer to maintain its function over a long period of time. Further, since a light transmissive resin film having a glass transition temperature Tg of at least 65° C. and/or a heat resistant or continuous service temperature of at least 80° C. is used as the resinous protective film, the hot-melt web does not deteriorate even upon direct exposure to sunlight or other light sources.

The supports of light transmissive, heat resistant resins having a Tg of at least 65° C. and/or a heat resistant temperature (Tw) of at least 80° C. include fluororesin films, for example, homopolymers such as polyethylene terephthalate film (Tg 69° C.), heat resistant polyethylene naphthalate film (Tg 113° C.), polychlorotrifluoroethylene (PCTFE, Tw 150° C.) commercially available as Neoflon CTFE from Daikin Industry K.K., polyvinylidene fluoride (PVDF, Tw 150° C., Tg 50° C.) commercially available as Denda DX film from Denki Kagaku Kogyo K.K., and polyvinyl fluoride (PVF, Tw 100° C.) commercially available as Tedlar PVF film from E. I. duPont; and copolymers such as ethylene tetrafluoride-perfluorovinyl ether copolymers (PFA, Tw 260° C.) commercially available as Neoflon PFA film from Daikin Industry K.K., ethylene tetrafluoride-propylene hexafluoride copolymers (FEP, Tw 200° C.) commercially available as FEP type Toyoflon film from Toray K.K., and ethylene tetrafluoride-ethylene copolymers (ETFE) commercially available as Tefzel ETFE film (Tw 150° C.) from E. I. duPont and AFLEX film (Tg 83° C.) from Asahi Glass K.K.; aromatic dicarboxylic acid-bisphenol copolymerized aromatic polyester polyarylate film (PAR castings, Tw 290° C., Tg 215° C.) commercially available as Elmeck from Kanegafuchi Chemical K.K. and polymethyl methacrylate film (PMMA, Tg 101° C.) commercially available as Technoloy R526 from Sumitomo Chemical K.K.; sulfurous polymer films such as polysulfone (PSF, Tg 190° C.) commercially available as Sumilite FS-1200 from Sumitomo Bakelite K.K., and polyether sulfone (PES, Tg 223° C.) commercially available as Sumilite FS-1300 from Sumitomo Bakelite K.K.; polycarbonate films (PC, Tg 150° C.) commercially available as Panlite from Teijin Chemicals K.K.; functional norbornene resins (Tw 164° C., Tg 171° C.) commercially available as ARTON from Nippon Synthetic Rubber K.K.; polymethacrylate resins (PMMA, Tg 93° C.); olefin-maleimide copolymers (Tg≧150° C.) commercially available as TI-160 from Toso K.K., para-aramide (Tw 200° C.) commercially available as Aramica R from Asahi Chemicals K.K., fluorinated polyimides (Tw≧200° C.), polystyrene (Tg 90° C.), polyvinyl chloride (Tg 70–80° C.), and cellulose triacetate (Tg 107° C.). Of these, the heat resistant polyethylene naphthalate film (Tg 113° C.) is preferable to the PET film because it is superior in heat resistance in terms of Tg, heat resistance during long term service, Young's modulus (or stiffness), rupture strength, heat shrinkage factor, low oligomer content, gas barrier, hydrolytic resistance, moisture permeability, temperature coefficient of expansion, and photo-degradation of physical properties. As compared with other polymers, the polyethylene naphthalate film has a good overall profile of rupture strength, heat resistance, dimensional stability, moisture permeability and cost.

The resinous support should have a glass transition temperature Tg of at least 65° C., preferably at least 70° C., more preferably at least 80° C., most preferably at least 110° C.. The upper limit of Tg is not critical although it is usually about 130° C. The heat resistant or continuous service temperature should be at least 80° C., preferably at least 100° C., more preferably at least 110° C. The upper limit of the heat resistant temperature is not critical, but the higher the better, and is usually about 250° C. The thickness of the resinous support is properly determined in accordance with the parameters of a member to be laminated therewith and the strength and flexural rigidity required for the support although it is usually about 5 to 100 μm, preferably about 20 to 90 μm. A resinous support with a thickness of less than 5 μm would achieve less effective surface protection and a hot-melt web obtained by applying an adhesive layer thereto would be liable to deform. A resinous support with a thickness of more than 100 μm would have a low light transmittance in the case of a film loaded with microparticulate $Al_2O_3$ or $SiO_2$ and become less amenable to lamination in a roll form and hence, obstruct continuous manufacture. The resinous support should preferably have a rate of change of its dynamic modulus within 30%, more preferably within 20% at a temperature of 0° C. and/or 120° C. subsequent to thermocompression bonding. The magnitude of dynamic modulus is preferably in the range of $1\times10^9$ to $1\times10^{12}$ $dyn/cm^2$. If the rate of change of dynamic modulus between 0° C. and 120° C. after thermocompression bonding is in excess of 30%, internal stresses would be generated in excess of the buffer action of the buffer adhesive layer, causing a lowering of bonding force, peeling of the hot-melt web, and deformation of the laminate.

By the term "light transmissive" resin of the support, it is meant that at least 70%, preferably at least 80% of light in the visible spectrum is transmitted by the support.

The resinous support should preferably have a molecular orientation ratio (MOR) value, representative of a degree of molecular orientation, of 1.0 to 3.0, more preferably 1.0 to 2.0, especially 1.0 to 1.8. MOR values within this range ensure that the laminate is little deformed. The MOR value representative of a degree of molecular orientation is described in Convertech, March 1998, Shigeyoshi Osaki, "Quality Control of Film Sheets Using Microwave Molecular Orientation Meter" and Seikei-Kakou, Vol. 17, No. 11, 1995, Y. Zushi, T. Niwa, S. Hibi, S. Nagata, and T. Tani, "Molecular Orientation Behavior On Biaxial Stretching." Larger MOR values indicate greater anisotropy, with a MOR value of 1.0 indicating the highest isotropy.

As to the degree of molecular orientation, a single resinous film may have different MOR values at different sites. Especially in the event of a biaxially stretched film, the film tends to exhibit a higher degree of molecular orientation at its edge where it has been secured during stretching. On account of this tendency, it is recommended that even when a film is made of a resin normally having a satisfactory degree of molecular orientation, the film should be examined for a degree of molecular orientation at several sites and confirmed to have degrees of molecular orientation within the desired range before it can be used in the invention.

Measurement of MOR is made, for example, by directing microwave to a rotating sample and measuring the intensity of transmitted microwave. More particularly, the interaction between the microwave electric field with a certain frequency and dipoles of the polymer is correlated to the inner product of their vectors. When the sample is rotated in the microwave polarization electric field, the intensity of transmitted microwave changes due to the anisotropy of dielectric constant, from which a degree of molecular orientation can be determined. The microwave used in this measurement is not critical although it usually has a frequency of 4 GHz or 12 GHz. The meter for measuring a degree of molecular orientation utilizing this principle is commercially available as molecular orientation meters MOA-5001A, 5012A, 3001A and 3012A from Shin-Oji Paper K.K. Alternatively, MOR values may be determined by x-ray diffraction, infrared dichroic, polarization fluoroscopic, ultrasonic, optical and NMR analyses.

Preferably the MOR value in the above-defined range should also hold for a component of a member to which the hot-melt web is to be applied, for example, a flexible substrate.

The buffer adhesive layer contains a thermosetting resin and an organic peroxide. Typical thermosetting resins are ethylene-vinyl acetate copolymers (EVA) having a vinyl acetate content of about 15 to 50% by weight.

The organic peroxide may be selected from those compounds which decompose to generate radicals at temperatures above 80° C., especially above 90° C. With the stability of organic peroxide upon blending taken into account, it should preferably have a decomposition temperature, which provides a half-life of 10 hours, of at least 70° C. Examples of the organic peroxide for thermosetting resins include 2,5-dimethylhexane-2,5-dihydroperoxide, 2,5-dimethyl-2,5-di(t-butylperoxy)hexane-3, di-t-butylperoxide, 2,5-dimethyl-2,5-di(t-butylperoxy)-hexane, dicumyl peroxide, α,α'-bis(t-butylperoxyisopropyl)-benzene, n-butyl-4,4-bis(t-butylperoxy)valerate, 2,2-bis(t-butylperoxy)butane, 1,1-bis(t-butylperoxy)-3,3,5-trimethyl-cyclohexane, t-butylperoxybenzoate, and benzoyl peroxide. These peroxides may be used alone or as a mixture of two or more in any desired mix ratio. The amount of the organic peroxide blended is preferably less than 10 parts, more preferably 0.5 to 6 parts by weight per 100 parts by weight of the thermosetting resin.

If desired, UV absorbers may be added. The addition of UV absorbers improves the UV light resistance of the film itself and prevents deterioration by light of a thin film of α-Si etc. constituting the photoelectric conversion section. Especially when a polymer film is located on the light-receiving surface side, a benzophenone or benzotriazole UV absorber having a UV shielding function is preferably incorporated on the light-receiving side surface or within the polymer and further in the buffer adhesive layer as typified by crosslinkable EVA by surface treatment or mixing.

As the UV absorbers, various aromatic organic compounds may be used. Especially the compounds of the following chemical formulae 1 are advantageous because of minimized yellowing and minimized bleed-out onto the film surface during long-term use. Of these, benzotriazole compounds are especially preferred. Also, zinc oxide (ZnO) microparticulates may be similarly used as a chemically stable inorganic UV absorber.

A transparent silica thin film which is dense at low temperatures is formed by dispersing ZnO microparticulates in a xylene solution of perhydropolysilazane (Mn=600 to 2,000) (N-V120 by Tonen K.K.), applying the dispersion onto a polyether sulfone resin film to a thickness of about 0.5 μm, and steam oxidizing at 90° C. (80% RM) for one hour (in the presence of a 5% aqueous solution of trimethylamine as a catalyst), wherein ZnO is added so as to give a $SiO_2$/ZnO ratio of 45/55 by weight. When this film is formed at the top on the light-receiving surface side of the solar battery as a transparent support, it serves as an inorganic UV-cutting, transparent, protective film effective for improving the outdoor weather resistance of the cell.

| Chemical name | Structural formula | |
|---|---|---|
| 2,4-Dihydroxybenzophenone<br>MW = 214 | $C_{13}H_{10}O_3$ | 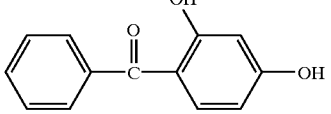 |
| 2-Hydroxy-4-methoxybenzophenone<br>MW = 228 | $C_{14}H_{12}O_3$ | 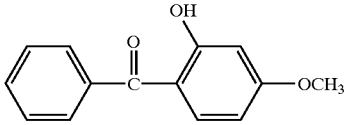 |
| 2-Hydroxy-4-methoxybenzophenone-5-sulfonic acid<br>MW = 308 | $C_{14}H_{12}O_6S$ | 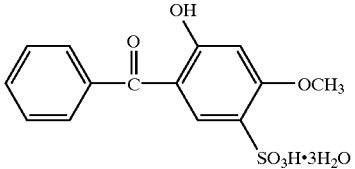 |
| 2-Hydroxy-4-octyloxybenzophenone<br>MW = 326 | $C_{21}H_{26}O_3$ | 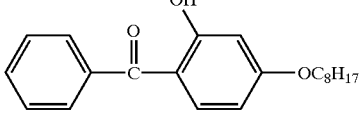 |
| 2,2',4,4'-Tetrahydroxybenzophenone<br>MW = 246 | $C_{13}H_{10}O_5$ | 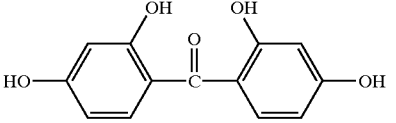 |
| 2-(-2-Hydroxy-5-methylphenyl)benzotriazole<br>MW = 225 | $C_{13}H_{11}N_3O$ | 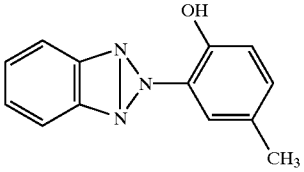 |
| 2-[2-Hydroxy-3-(3,4,5,6-tetra-hydrophthalimide-methyl)-5-methylphenyl]benzotriazole<br>MW = 385 | $C_{22}H_{16}N_4O_3$ | 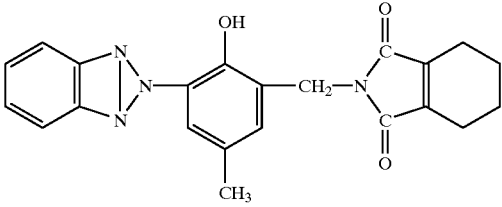 |
| 2-(2-Hydroxy-3-tert-butyl-5-methylphenyl)-5-chlorobenzotriazole<br>MW = 316 | $C_{20}H_{18}N_3OCl$ | 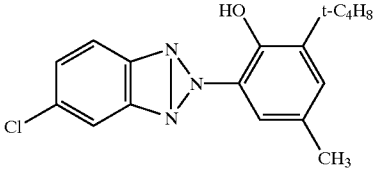 |
| 2-(2-Hydroxy-4-octyloxyphenyl)benzotriazole<br>MW = 339 | $C_{20}H_{25}N_3O_2$ | 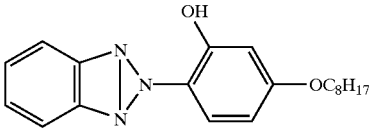 |

-continued

| Chemical name | | Structural formula |
|---|---|---|
| 2-(2-Hydroxy-3,5-tert-butylphenyl)benzotriazole<br>MW = 323 | $C_{20}H_{25}N_3O$ | |
| 2-(2-Hydroxy-5-tert-octylphenyl)benzotriazole<br>MW = 323 | $C_{20}H_{25}N_3O$ | |
| 2-(2-Hydroxy-3,5-di-tert-amylphenyl)benzotriazole<br>MW = 352 | $C_{22}H_{29}N_3O$ | |
| 2,4-Di-tert-butylphenyl-3,5-di-tert-butyl-4-<br>4-hydroxybenzoate<br>MW = 439 | $C_{29}H_{42}O_3$ | |

If desired, additives such as curing promoters may be added. In one exemplary embodiment wherein the hot-melt web is laid on a member to form a laminate, an organosilane compound represented by the structure: $RSi(OR)_3$ wherein R is $C_2H_5$, for example, may be blended in an amount of up to 6 parts by weight on the same basis as an anti-foaming agent or foam inhibitor in the buffer adhesive layer. In the heating/compressing step, the organosiloxane compound reacts with the organic peroxide to generate free radicals, which become a crosslinking agent for the ethylene-acetic acid copolymer and are thus eventually incorporated in the buffer adhesive layer. The organosiloxane compound has the additional function of preventing sticking and facilitating separation between the buffer adhesive layer and the support back surface when the hot-melt web is stored in a roll form or as a stack of sections.

The thickness of the buffer adhesive layer may be adjusted as appropriate in accordance with the type of organic peroxide, the service environment, and the member to which the hot-melt web is laminated. Preferably the buffer adhesive layer has a thickness of about 3 to 500 μm, more preferably about 3 to 50 μm, most preferably about 10 to 40 μm. A buffer adhesive layer of thinner than 3 μm would exert a less buffer effect whereas a buffer adhesive layer of thicker than 500 μm would cause a lowering of light transmittance and tend to leave fins upon punching. It is noted that since the adhesive layer is far more light transmissive than the support, a thickness of up to 10,000 μm is acceptable for outdoor service or use under a high illuminance source. The buffer adhesive layer should preferably have a dynamic modulus of up to $5 \times 10^9$ dyn/cm$^2$ at 20° C. and at least $1 \times 10^6$ dyn/cm$^2$ at 100° C., more preferably $1 \times 10^9$ to $1 \times 10^6$ dyn/cm$^2$ at 20° C. and $2 \times 10^6$ to $1 \times 10^9$ dyn/cm$^2$ at 100° C., after thermocompression bonding. Also the buffer adhesive layer should preferably have a maximum peak value of tan δ in a temperature range of up to 20° C., more preferably in a range of −100° C. to +15° C., after thermo-compression bonding.

Particularly when the hot-melt web is used as a laminate protective film, the buffer adhesive layer is provided on only one surface of the resinous support. When a solar battery substrate and a laminate film support have a great difference in thermal shrinkage factor upon heating because of the material difference, as will be described later, the buffer adhesive layer is provided on both surfaces of the resinous support so that the cell laminate becomes flat. The double side web is advantageous for outdoor use in a rigorous environment. When the hot-melt web is used as joining means in the manufacture of optical recording media and flat panel displays, as will be described later, the buffer adhesive layer is provided on either surface of the resinous support. In the double side web, the resinous support and the buffer adhesive layers should preferably be thinner within the above-described thickness ranges. The buffer adhesive layer may also be used as a separate sheet of 4 to 6 mm thick.

The buffer adhesive layer is provided on the resinous support by any well-known means such as coating or extrusion coating. The total thickness of the resinous support and the buffer adhesive layer or layers is preferably in the range of 10 to 600 μm, more preferably 10 to 120 μm, further preferably 30 to 90 μm, most preferably 60 to 80 μm.

In the hot-melt web according to the invention, the buffer adhesive layer is preferably embossed on its surface. Particularly when the hot-melt web is subject to pressure lamination, it is preferred to form the emboss pattern, especially as a pattern of streaks extending in the same direction as the feed direction during lamination. When the hot-melt web is used for laminating members, the direction of the emboss pattern is arbitrary. An optimum direction may be selected for the emboss pattern in accordance with the laminating direction or the type of members to be laminated. The embossing or the formation of steaks affords bubble escape passages, minimizing the entrainment of bubbles. Particularly when pressure lamination is carried out by a roll laminator by wrapping a film around the laminator roll and feeding a member thereto with the aid of the nipple roll, bubbles will find a way of easy escape in the laminating direction. The size, spacing and population of streaks to be formed by embossment are not critical. For example, the buffer adhesive layer is preferably embossed to a surface roughness Ra of 0.4 to 10 $\mu$m, more preferably 0.6 to 0.8 $\mu$m and an average peak-to-peak spacing of 50 to 180 $\mu$m, more preferably 60 to 140 $\mu$m. The embossing means is not critical and conventional embossing techniques may be used. Alternatively, a release film is once embossed and that emboss pattern is transferred to the buffer adhesive layer.

Next, the method for preparing the solar battery module is described. There are furnished a hot-melt web having a buffer adhesive layer on at least one surface of a light transmissive, heat resistant resin support having a Tg of at least 65° C. and a member to be laminated, typically a solar battery sheet having an upper or light-receiving surface to be protected. The hot-melt web is laid on the member preferably such that the buffer adhesive layer of the web is in close contact with the light-receiving surface of the member. This assembly is passed through a roll laminator where thermocompression bonding is carried out, preferably at a temperature of 100 to 120° C. and a linear pressure of 20 to 70 g/cm. Although reference is mainly made to a one-side laminate having only one hot-melt web laid on a member, a double-side laminate having hot-melt webs on opposite sides of a member may also be employed depending on the type of a member to be laminated and the service environment. In the case of the double-side laminate, a sandwich of a member between hot-melt webs, with the buffer adhesive layers faced to the member, may be passed through a roll laminator for achieving thermocompression bonding.

The composite sheet thus obtained is then cut to sections of predetermined dimensions. The sheet sections are stacked and received in a container equipped with heating and compressing means, typically an autoclave. Preferably in a dry air or nitrogen atmosphere, especially in a nitrogen atmosphere, a substantially uniform mechanical pressure of 0.01 to 5.0 kg, especially 0.1 to 5.0 kg is applied to the stack of sheet sections in a direction perpendicular to the major surfaces of the sheet sections, typically in a vertical direction while the stack is heated at a temperature of at least 70° C., especially 140 to 180° C. (The pressure applied during heating is 3 to 15 kg/cm$^2$.) This heat pressing is continued for about 30 to 120 minutes for achieving heat crosslinking, deaeration and a firm bond, producing a laminate according to the invention. The heating temperature and hydrostatic pressure applied by the heating and compressing means may be adjusted in accordance with the particular member and hot-melt web employed. The mechanical pressure may be applied at any desired timing. Preferably the pressure is maintained even after heating and until cooling to room temperature. One preferred procedure involves the step of bubble removal by heating above the curing temperature of the adhesive layer, more preferably at a temperature of 70 to 100° C., applying a pressure of 5 to 10 kg/cm$^2$, and maintaining the temperature and pressure for 15 to 60 minutes, and the subsequent step of thermosetting by heating at a higher temperature, more preferably at a temperature of 100 to 170° C., especially 120 to 170° C. and maintaining the pressure of 3 to 15 kg/cm$^2$, especially 5 to 10 kg/cm$^2$ at the temperature for a further 5 to 60 minutes, especially 15 to 60 minutes.

Since lamination is carried out by means of a roll laminator, the influence of irregularities on the member to be laminated, for example, a fine pattern of comb-shaped electrodes on a solar battery or a fine pattern of insulator for cell isolation is minimized. More particularly, the member/hot-melt web assembly is fed to a roll laminator while the structured surface of the member is in contact with the buffer adhesive layer which is heated to a more fluidized state. The assembly is clamped between the elastic rolls of the laminator while it is moved forward. The bubbles which are probably left in the shades of pattern lines on the structured surface are effectively expelled out by the hydraulic forces acting thereon due to the sliding stresses produced between the elastic rolls.

Residual bubbles which are not completely removed by the roll laminator are removed in the subsequent heat crosslinking step by the heating and compressing means. At the thermocompression bonding stage, it is preferred that a heat resistant elastomer sheet is laid on the upper (light-receiving) surface of each composite sheet section and a metal cover plate is laid thereon. A plurality of metal cover plate/elastomer sheet/composite sheet section units are placed one on top of the other. A mechanical pressure is vertically applied to the stack via a high rigidity, flat smooth platen of SUS or the like by a compressing means such as a pneumatic cylinder. In this way, the module sheet having a functional thin film on a plastic substrate which has been randomly deformed by the thermal contraction and internal stresses of the functional thin film is laminated with the hot-melt web into a device which is now corrected to be smooth and flat.

It is understood that the member to be laminated consists of plural different components which are different in rigidity and thickness, for example, $\alpha$-Si, ITO, aluminum alloy, interlayer insulating films, and sealing insulating protective film in the event of a solar battery. By applying a mechanical pressure to the laminate sections lying in the above-described layer structure in the heat crosslinking step by heating and compression, the components are laminated and integrated with the hot-melt web so that random deformations contained in the composite sheet whose layers have different heat shrinkage factors and internal stresses at the end of their formation may be readily corrected. Additionally, since the stack of plural composite sheet sections is heat pressed, flattening correction can be simultaneously carried out on a plurality of sheet sections, which is advantageous for mass production. As compared with coating, the lamination of the hot-melt web is effective in endowing the surface with superior flatness and smoothness, resulting in products having a good outer appearance. This adds to the commodity value of products.

Although within the integrated laminate, the support and laminate member constitute the majority of members dictating the thickness of the device, flatness and smoothness are achieved to a level at least equal to the use of rigid supports of metals (e.g., SUS) and glass having a thickness of about 100 $\mu$m. As compared with sheet structures using such metal supports or glass supports, the laminate can be punched by simple pneumatic press working and formed with through-holes by means of a YAG laser. Therefore, compared with the sheet structures using metal supports or glass supports, thin film devices can be precision worked by simple means in a high productivity manner, contributing to a cost reduction in mass-scale production. When combined with patterning by a screen printing technique, the lamination process can be quickly adapted to changes of device design, achieving a further cost reduction.

The heat resistant elastomer sheet to be stacked is not critical insofar as it withstands the heating temperature mentioned above. A proper choice may be made of well-known heat resistant elastomers, for example, heat resistant silicone rubber, fluoro-rubber (e.g., Viton), and fluorosilicone rubber. The thickness of the heat resistant elastomer sheet is not critical although it is usually in the range of about 0.5 to 10 mm.

The metal cover plate may be made of aluminum, stainless steel, brass, or steel sheets. Aluminum is preferable because of its light weight and good heat transfer. The thickness of the metal plate is not critical although it is usually about 0.2 to 3 mm. The metal plate may be surface treated by well-known means, for example, aluminum anodizing, plating such as chromium, nickel or nickel-chromium plating, or paint coating.

In the solar battery module of the invention, for the purpose of cost reduction, a light and weather resistant coating may be provided on the solar battery cell surface instead of the hot-melt web mentioned above. As compared with the above-mentioned hot laminated assembly, such a resin coating is somewhat inferior in flatness and weather resistance, but contributes to low-cost, mass-scale manufacture because the laminating and flattening steps can be omitted. This is suitable especially when the module is built in an equipment or mainly intended for indoor use.

For the resin coating used to this end, a coating film having a well-balanced profile of transparency, toughness, adhesion to the transparent electrode or the like, surface hardness, heat resistance, freeze resistance, low moisture absorption, and low gas barrier is preferable. In particular, in order that the resin be soluble in organic solvents, have a molecular weight (Mn) of about 2,000 to 3,000 or lower, and maintain the above-mentioned mechanical strength as a coating, base resin capable of exerting the above-mentioned properties are preferably those thermosetting resins which undergo crosslinking reaction with melamine resins or non-yellowing isocyanate compounds (low-temperature-curable blocked isocyanate in which isocyanate groups of non-yellowing isocyanate compounds are blocked with active methylene groups of acetylacetone (Duranate "MF-K60X" by Asahi Chemicals K.K.) and low-temperature-curable blocked isocyanate in which isocyanate groups of non-yellowing isocyanate compounds are blocked with MEK, oxime, etc.) below 200° C., which is the heat resistant temperature of plastic supports, to form higher molecular weight resins. The thermosetting resins have improved transparency and undergo least color changes due to aging and optical degradation.

Exemplary preferred fluorochemical resins include Lumiflon resins (Asahi Glass K.K.) which are copolymers of ethylene trifluoride or ethylene tetrafluoride with a vinyl monomer in which the H moiety of the ethylene chain is replaced by —OR, —OH or —ORCOOH; polyurethane resins obtained by condensing aliphatic or alicyclic polyesters or polyether prepolymers with non-yellowing isocyanate compounds (e.g., PTMG/Colone HX cured product by Nippon Polyurethane K.K.); cured products of saturated polyester resins (copolymers of such esters of ethylene glycol or neopentyl glycol with phthalic acid or adipic acid, e.g., Viron by Toyobo K.K.) with the above-mentioned non-yellowing isocyanate or melamine compounds; cured products of epoxy resins (e.g., Epikoat 1009 by Yuka Shell K.K.) or phenoxy resins (PKHH by UCC) with the above-mentioned curing agents; and phosphazene monomers having functional groups capable of polymerization reaction and curable with partially saponified acrylic polyols or the above-mentioned non-yellowing isocyanate compounds (e.g., PPZ Monomer by Idemitsu K.K.).

The coating may be formed by such techniques as coating, screen printing, and spin coating.

EXAMPLE

Example 1

Preparation process

As shown in FIG. 1, a solar better cell-forming structure comprising a lower electrode layer 2, an amorphous silicon layer 3 having a pn junction or pin junction, an insulating layer 4, and an ITO transparent electrode layer 5 formed on a flexible substrate 1 was provided with a through-hole 10 and open channels 10a by laser machining.

Figure 2:
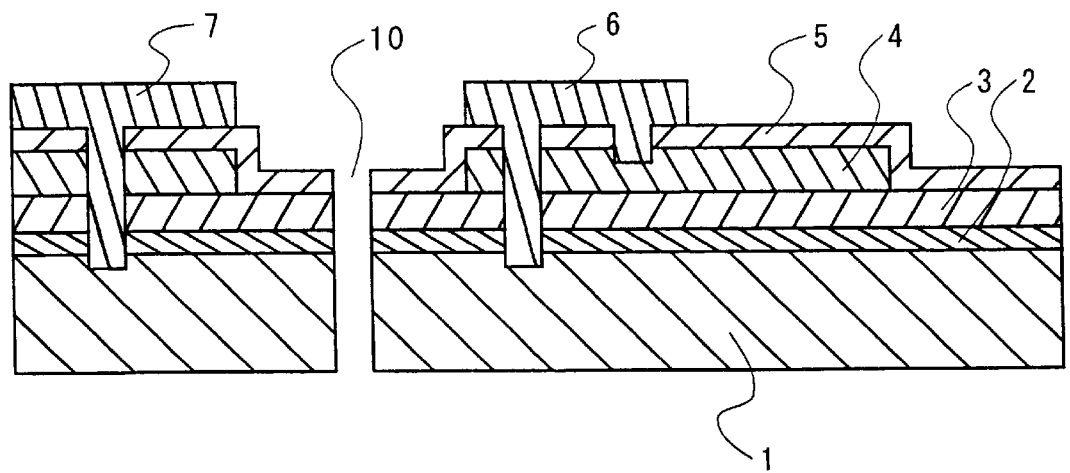
FIG. 2 is a fragmental cross-section illustrating one step of a process for preparing a solar battery cell for use in a solar battery module according to the invention.
Figure 3:
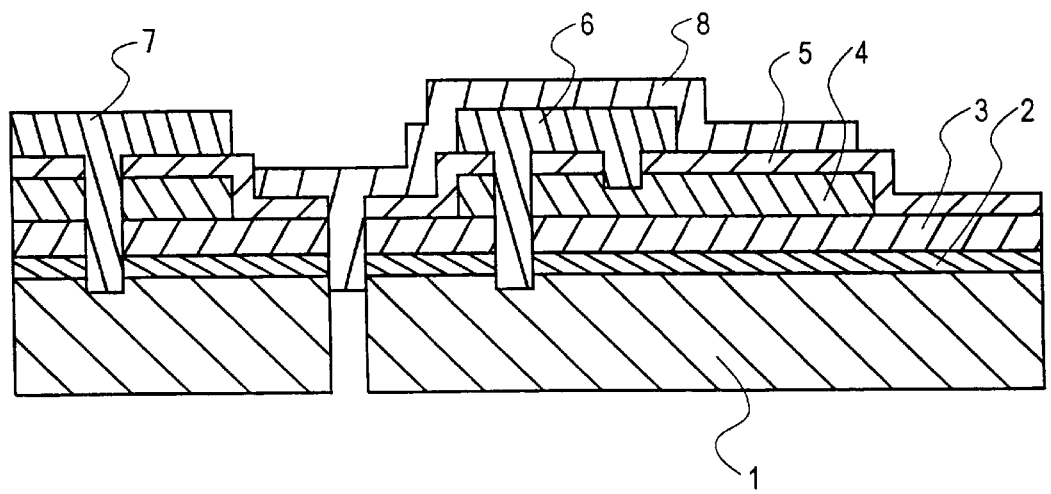
FIG. 3 is a fragmental cross-section illustrating one step of a process for preparing a solar battery cell for use in a solar battery module according to the invention.

Next, as shown in FIG. 2, a first isolating layer 6 and a second isolating layer 7 were formed over the ITO transparent electrode layer 5 where the open channels 10a were formed. Further, as shown in FIG. 3, a wiring electrode layer 8 was formed over the first isolating layer 6 and through-hole 10.

Next, as shown in FIG. 4, after a reverse-side lead-out electrode 9 was formed if necessary, an insulating color ink which was prepared in accordance with the following insulating color resin composition 1 was applied onto the wiring electrode 8 to form an insulating color film 11.

The insulating color resin composition 1 whose color was approximate to the surface color of the solar battery's photoelectric conversion section is used, in the case of the solar batter cell shown in FIG. 4, by coating it over the insulating film (primary printed resin) 4, isolating layers 6, 7 exposed on the solar battery surface (secondary printed resin), electrode of silver paste serving as wiring electrode 8 (for suppressing the high light reflectance of the electrode).

| Insulating color resin composition 1 | |
|---|---|
| | Parts by weight |
| Phenoxy resin (PKHH by UCC, Mn = 15400) | 14 |
| Cyclohexanone | 15 |
| Isophorone | 15 |
| Rutile titanium dioxide (Ishihara Industry K.K., mean particle size 270 nm) | 32 |
| Red iron oxide (Toda Industry K.K., mean particle size 300 nm) | 15 |
| Dispersant (oleic acid) | 3 |
| Anti-foaming agent (TSA-720 by Toshiba Silicone K.K.) | 1 |
| Leveling agent (KS-66 by Shin-Etsu Silicone K.K.) | 1 |

The phenoxy resin was completely dissolved in a solvent mixture of cyclohexanone and isophorone, and titanium dioxide and red iron oxide were dispersed therein together with the dispersant in a zirconia ball mill for 48 hours. The anti-foaming agent and leveling agent were then added to the dispersion, which was mixed for a further 2 hours.

Next, the following hot crosslinking reaction components were added to the dispersion, which was mixed and dispersed for a further 20 minutes, obtaining the resin composition for insulating color film.

|  | Parts by weight |
|---|---|
| n-butylated melamine resin (Uban 21R by Mitsui-Toatsu Chemical K.K.) | 5 |
| Curing accelerator (Catalyst 6000 by Mitsui-Toatsu Chemical K.K.) | 0.03 |

The thus obtained insulating resin composition ink was primary printed onto the insulating layer 4 shown in FIG. 1 through a 150-mesh stainless steel screen and thermoset in an oven at 160° C. for 10 minutes. On this insulating film, the ITO transparent electrode layer 5 was then formed by argon gas sputtering. During this sputtering step, no damages were found on the insulating film and the uniform ITO transparent electrode layer 5 was deposited.

Next, on the first and second isolating layers 6 and 7 shown in FIG. 2 and the wiring electrode 8 shown in FIG. 4, the insulating color ink was again printed through a 150-mesh stainless steel screen and thermoset in an oven at 160° C. for 10 minutes. The insulating color ink was coated onto the insulating film 4 and isolating layers 6, 7 or overlaid for suppressing the high light reflectance of the wiring electrode 8 of silver paste in this way, and thus covered the overall surface layer of the solar battery except for the photoelectric conversion section. There was obtained a flexible amorphous silicon solar battery cell which was uniformed to a color substantially equal to the surface color of the photoelectric conversion layer.

Next, a lamination film comprising a PEN film having excellent physical strength including environmental reliability as a support and a buffer adhesive layer applied thereon was laid on the light-receiving surface of the solar battery and sealed thereto.

More specifically, the lamination film used was prepared by furnishing a PEN film of 50 μm thick (Tg: 113° C.) as the flexible film support having light transparency and heat resistance. The buffer adhesive was prepared by blending dicumyl peroxide as an organic peroxide in an ethylene-vinyl acetate copolymer resin (EVA, vinyl acetate content about 15–50% by weight) in an amount of 7 parts by weight of the curing agent per 100 parts by weight of the EVA and further blending minor amounts of additives such as a curing accelerator. The buffer adhesive was applied to one surface of the resin film support to a thickness of 20 μm to form the buffer adhesive layer.

After the lamination, flattening treatment was carried out to a level meeting the specifications of watch parts, obtaining a film solar cell complying with the watch dial plate.

Alternatively, it is acceptable to simplify the above-mentioned procedure by omitting the laminate sealing while insuring the reliability of the cell to some extent, that is, to cover the surface of the cell on the light-receiving side solely with a transparent protective coating film having light resistance. By protecting the surface solely with the coating film in this way, the cost of the solar battery can be reduced so that it is marketed at a low price.

Next, onto the solar battery cell having the uniformed tone and flexibility, a whitish watch dial plate having the optical functions of a diffuse transmission layer and a selective reflecting layer (material: plastic plate of acrylic resin with alumina ultrafine particles dispersed therein, thickness: 500 μm, overall light transmittance 52%) was joined with substantially no gap left therebetween, obtaining a solar watch.

Comparative Example

A solar battery cell was prepared as in Example 1 except that an insulating color resin composition 2 of the following formulation was used, following which a solar watch was similarly assembled.

Insulating color resin composition 2

|  | Parts by weight |
|---|---|
| Phenoxy resin (PKHH by UCC, Mn = 15400) | 20 |
| Cyclohexanone | 40 |
| Isophorone | 30 |
| High-resistance carbon black (Degussa, mean particle size 25 nm) | 4 |
| Aerosil (Degussa, mean particle size 15 nm) | 10 |
| Dispersant (oleic acid) | 3 |
| Anti-foaming agent (TSA-720 by Toshiba Silicone K.K.) | 1 |
| Leveling agent (KS-66 by Shin-Etsu Silicone K.K.) | 1 |

Test Method

For the flexible solar battery cell having a tone uniformed to the photoelectric conversion section and the solar watch having the cell integrated with the whitish watch dial plate in Example and the solar batter cell and the solar watch with a whitish watch dial plate in Comparative Example, "tristimulus values" and "L*a*b* color space" (representing brightness, redness and blueness, respectively) were measured using a high-speed calorimetric spectrophotometer CMS-35sp by Murakami Color Institute K.K.

For the watch dial plate, an overall light transmittance was also measured according to JIS K-7361, and a comparison was made by carrying out visual evaluation under natural light and a fluorescent lamp.

Results

1) The solar battery cell prepared in Example, the solar battery cell prepared in Comparative Example, and the solar watches of Example and Comparative Example were subjected to colorimetry analysis by the above-described test method.

Based on the L*a*b* values, the color difference ΔE in color of reflected light of incident natural light between the surface color of the photoelectric conversion section and the insulating resin layer prepared in Example was calculated, with the result indicating a value of 2.39. This value represents the color at the limit level below which the cell can be used, without further modification, as a cell having a uniform color between the power generating film and the surface and as the watch dial plate or portable solar battery.

2) For the solar watch prepared in Example, a color difference value ΔE of reflected color was determined for the purpose of comparison with the color to incident natural light through a whitish watch dial plate of general use level, with the result indicating a value of 0.16, which ranges up to 0.2 NBS unit. On visual observation, the presence of the solar battery below the whitish watch dial plate could not be sensed, even over especially outstanding color difference regions such as the isolating portion 23 (crisscross pattern), connections 27, 28, 29 and lead-out electrodes 25, 26 (circumferential pattern).

3) The solar battery prepared in Comparative Example showed a ΔE value of 34.86, and the solar battery having the whitish watch dial plate rested thereon showed a ΔE value of at least 12 NBS units. On visual observation, the crisscross and circumferential patterns were definitely viewed, indicating a serious problem from the design aspect.

4) For the solar watch prepared in Example, a color difference value ΔE of reflected color was determined for the purpose of comparison with the color to incident natural light through a special blackish watch dial plate for diver watches on outdoor use, with the result indicating a value of 3.35, which ranges beyond 0.3 NBS unit.

On visual observation, the color ink of insulating color resin composition 2 used in Comparative Example was applied to the isolating portion 23 (crisscross pattern), connections 27, 28, 29 and lead-out electrodes 25, 26 (circumferential pattern) by a screen printing technique so hat these regions and even the overcoat layer were covered with the black color ink film.

This color ink film had a color difference value ΔE of at least 12 from the photoelectric conversion region as reported in Comparative Example of Table 1.

However, the special black watch dial plate used herein had, as measured according to JIS K-7361, an overall light transmittance as low as 26.0% and a diffuse transmittance of 2.7%, indicating the substantial absence of the shielding effect of reflected light by light diffusion of a filter, and a low haze value of 10.4%.

The use of such a black dial plate causes a substantial loss of the light quantity available to insure the operation of a solar watch, which is detrimental to the power generation efficacy of the cell. However, it is advantageous for the design as a black dial plate for sports use. Although the ΔE value associated with the use of a black color ink film was 3.35, that is, in excess of 3.0, the non-power generating regions were less outstanding on visual observation. By the way, when the non-power generating regions were similarly covered with an ink film of insulating color resin composition 1 used on the white dial plate in Example, and the above-mentioned special black dial plate having a low transmittance and low haze was rested thereon, the color difference ΔE from the standard cell was 2.50, indicating a greater color difference than in the case of insulating color resin composition 2. This suggests that the use of such a dial plate having special optical characteristics is advantageous in stressing blackness from the design aspect.

Figure 6:
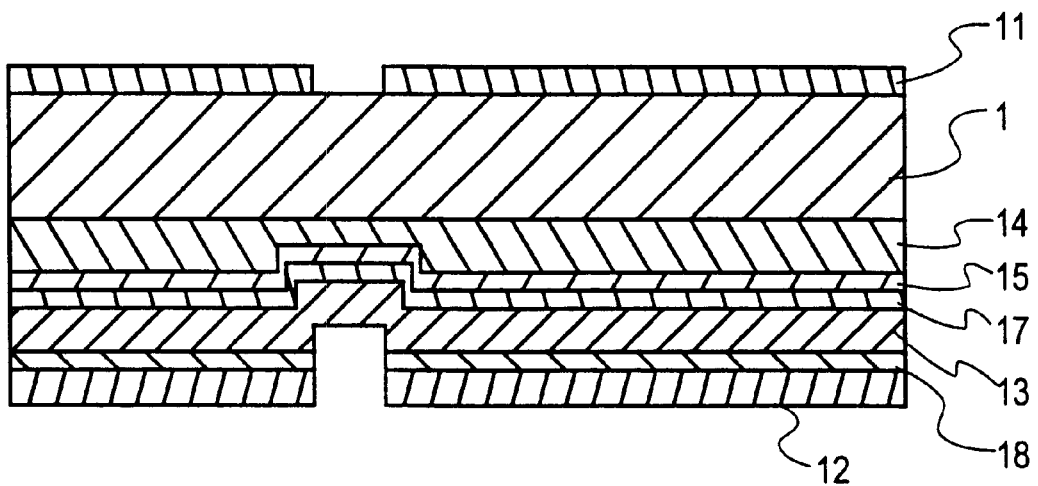
FIG. 6 is a fragmental cross-section illustrating another construction of a solar battery cell according to the invention.

In addition to the cell having the outer configuration shown in FIG. 5 and the above-described structure, a cell of the same outer configuration and having an integration structure on the transparent film support rear surface was fabricated by oxidizing the above-described perhydroxypolysilazane with steam to form a silica layer 14 (containing ZnO UV-cutting agent) below a transparent PEN film 1 of 75 μm thick, and depositing below the silica layer 14, a transparent conductive layer ITO 15, a ZnO layer 17, an α-Si layer 13, a ZnO transparent conductive layer 18 (for light confinement), and an aluminum layer (metal underlying electrode) 12 to thereby construct a solar battery. The cross-sectional structure is shown in FIG. 6. To protect the aluminum underlying electrode 12, a transparent protective layer such as a transparent insulating layer obtained by thermosetting a phenoxy resin with a melamine resin as in Japanese Patent Application No. 9-320476 or a laminate film may be disposed below it.

In the process of fabricating such a cell, the respective thin layers were formed by covering the underlying with a metal mask and effecting patterned layer deposition by sputtering or plasma CVD. Patterning by laser scribing or screen printing was avoided.

However, when the cell was visually observed from the light-receiving surface side as shown in FIG. 5, the high reflectance due to metallic luster of the lowermost layer or aluminum electrode made the crisscross lines especially outstanding and provided a further increased contrast to the power generating region, which could not be hidden even when various dial plates were rested thereon.

Accordingly, a process of covering the top side (light-receiving side) of the PEN film, along the regions of the crisscross lines corresponding to the high reflectance aluminum electrode, with an ink layer of insulating color resin composition 1 used in Example 3 (by a screen printing/patterning technique) was effective in improving the design feature when a dial plate was rested thereon.

5) The whitish watch dial plate used herein had an overall light transmittance of 52.3%, a diffuse light transmittance of 32.5%, and a haze value of 62.2% as measured according to JIS K-7361, acquiring a sufficient light quantity to insure indoor operation as a solar watch.

6) It was confirmed that a solar watch or portable solar battery which is satisfactory from the design aspect can be fabricated by incorporating a filter (dial plate) in the solar battery in which the color difference value ΔE between the surface color of the power generating film and the cell coloring ink falls within 2.0 as calculated from the L*a*b* values and the regions other than the power generating film are covered with the ink to achieve the unity of surface color.

The results described above are summarized in Table 1.

TABLE 1

| Sample | X | Y | Z | x | y | L Brightness | a red ↓ green | b yellow ↓ blue | c Color saturation | H Hue | Color difference |
|---|---|---|---|---|---|---|---|---|---|---|---|
| Example cell | 14.52 | 14.19 | 14.49 | 0.35 | 0.33 | 44.51 | 6.47 | 2.24 | 8.25 | 10.84 | |
| Ink 1 | 13.67 | 13.09 | 13.62 | 0.34 | 0.32 | 42.91 | 8.11 | 1.55 | 8.25 | 10.84 | |
| Color difference | | | | | | | | | | | 2.39 |
| Example cell + Dial plate | 46.37 | 48.75 | 56.76 | 0.31 | 0.32 | 75.31 | 0.07 | −3.52 | −3.52 | 271.1 | |
| Ink 1 + Dial plate + Dial plate color difference | 46.39 | 48.72 | 56.71 | 0.31 | 0.32 | 75.28 | 0.23 | −3.52 | 3.53 | 273.7 | 0.16 |
| Comparative Example cell | 46.37 | 48.75 | 56.76 | 0.31 | 0.32 | 75.31 | 0.07 | −3.52 | −3.52 | 271.1 | |
| Comparative ink 2 | 1.16 | 11.24 | 1.65 | 0.29 | 0.31 | 10.82 | −0.61 | −3.28 | 3.33 | 259.7 | |
| Color difference + Dial plate color | | | | | | | | | | | 34.86 >12 |

TABLE 1-continued

| Sample | X | Y | Z | x | y | L Brightness | a red ↓ green | b yellow ↓ blue | c Color saturation | H Hue | Color difference |
|---|---|---|---|---|---|---|---|---|---|---|---|
| difference | | | | | | | | | | | |
| Example cell + Black dial plate | 0.77 | 0.73 | 1.12 | 0.29 | 0.28 | 6.55 | 3.13 | −4.59 | 5.56 | 304.4 | |
| Black dial plate + Ink 2 + Black dial plate color difference | 0.49 | 0.49 | 0.78 | 0.28 | 0.28 | 4.46 | 0.76 | −3.48 | 3.57 | 282.4 | 3.35 |

As seen from the above, in the example of the "solar watch" with stringent design requirements in which a primarily white, light-color "watch dial plate" is provided as the top layer of the solar battery, by constructing to the uniform color cell structure in which the exposed surface portion of the solar battery is as approximate to the battery surface color as possible and using the "ink," "cell" and "filter (dial plate)" such that the color difference value ΔE in reflected color to incident sunlight between the cell and the cell coloring ink as sensed through the whitish watch dial plate may fall within the range of up to 2.0 NBS units, a "solar watch" which was satisfactory from the design aspect could be fabricated.

Example 2

A solar battery module was prepared as in Example 1 except that a resin coating of the following composition was formed on the cell surface instead of the lamination film. The solar battery module was tested as in Example 1, finding that it had a certain effect of unifying tones and operated as a solar battery without problems.

| 10/23 Composition of resin coating | Parts by weight |
|---|---|
| OH-bearing fluoro-resin (Lumiflon LF200F by Asahi Glass K.K., hydroxyl value 26 mg KOH/g) | 20 |
| γ-butyrolactone | 40 |
| isophorone | 30 |
| Anti-foaming agent (TSA-720 by Toshiba Silicone K.K.) | 3 |
| Leveling agent (KS-66 by Shin-Etsu Silicone K.K.) | 1 |

The Lumiflon resin was completely dissolved in a solvent mixture of γ-butyrolactone and isophorone, and dispersed in a zirconia ball mill for 48 hours. The anti-foaming agent and leveling agent were then added to the dispersion, which was mixed for a further 2 hours. The following hot crosslinking reaction components were added.

| | Parts by weight |
|---|---|
| Methylated melamine resin (Sumimal M-40ST by Sumitomo Chemical K.K.) | 4 |
| Catalyst (dodecylbenzenesulfonic acid) | 0.13 |

The mixture was mixed and dispersed for a further 20 minutes, obtaining a resin coating composition having transparency and insulation and effective for the protection and sealing of the cell light-receiving surface.

The thus obtained composition was applied to the surface of the solar battery cell by a screen printing technique and thermoset at 150° C. for 90 minutes, forming a resin coating of about 20 μm thick.

Benefits of the Invention

There has been provided a solar battery module having a high efficiency power generating ability, a harmony of design without an odd sensation, and a freedom of design.

What is claimed is:

1. A solar battery module comprising:
   a substrate having a light-receiving surface;
   a photoelectric conversion section disposed on the light-receiving surface and configured to convert incident light into electricity, said photoelectric conversion section comprising silicon;
   an insulating color film disposed in regions other than said photoelectric conversion section and configured to reduce a color difference from said photoelectric conversion section; and
   a hot-melt web having a buffer adhesive layer containing a thermosetting resin laminated on the insulating color film and the photoelectric conversion section.

2. The solar battery module of claim 1 wherein said insulating color film comprises pigment particles dispersed in a binder.

3. The solar battery module of claim 1 wherein said insulating color film comprises a microparticulate white pigment as pigment particles dispersed therein.

4. The solar battery module of claim 1 wherein said photoelectric conversion section comprises a non-single-crystal silicon film.

5. The solar battery module of claim 1 further comprising a diffuse transmission layer above the light-receiving surface of the solar battery module.

6. The solar battery module of claim 5 wherein the color difference ΔE between the insulating color film and the photoelectric conversion section as perceived through the diffuse transmission layer is up to 5.0.

7. The solar battery module of claim 5 further comprising a selective reflecting layer disposed at least one of 1) above said diffuse transmission layer and 2) below said diffuse transmission layer.

8. The solar battery module of claim 5 wherein said diffuse transmission layer has an overall light transmittance of at least 20% and a haze of at least 8% in the visible spectrum.

9. The solar battery module of claim 1 wherein said photoelectric conversion section has a transparent conductive film.

10. The solar battery module of claim 1 wherein the substrate includes one of light transmissive, heat resistant resins, glass and stainless steel.

11. The solar battery module of claim 1 wherein at least one of 1) said substrate and 2) said buffer adhesive layer contains a UV absorber or has a UV absorber localized on a surface thereof.

12. The solar battery module of claim 1 wherein said buffer adhesive layer contains an organic peroxide.

13. The solar battery module of claim 1 wherein the hot-melt web has a support film, and the support film has one of a glass transition temperature of at least 65° C. and a heat resistant temperature of at least 80° C. prior to thermocompression bonding.

14. The solar battery module of claim 1 wherein the hot-melt web has a support film, and the support film has a molecular orientation ratio (MOR) of from 1.0 to 3.0 prior to thermocompression bonding.

15. The solar battery module of claim 12 wherein the organic peroxide has a decomposition temperature of at least 70° C. at a half life of 10 hours prior to thermocompression bonding.

16. The solar battery module of claim 1 further comprising a protective coating film having light transparency and heat resistance on said photoelectric conversion section.

17. The solar battery module of claim 16, wherein the hot-melt web is laminated on said protective coating.

18. A watch comprising the solar battery module of claim 1.

* * * * *